US00RE41069E

(19) United States
(12) Reissued Patent
Liang et al.

(10) Patent Number: US RE41,069 E
(45) Date of Reissued Patent: Jan. 5, 2010

(54) APPARATUS FOR CAPTURING IMAGE

(76) Inventors: Samuel Liang, No 9, Sulin Village, Anding Township, Tainan County (TW); Gene Tai, 3F., No. 16-2, Lane 281, Jhongyang Rd., Hsinchu City 300 (TW); Chuck Lo, 3F., No 62, Lane 567, Nanda Rd, Hsinchu City 300 (TW)

(21) Appl. No.: 11/327,831

(22) Filed: Jan. 6, 2006

Related U.S. Patent Documents

Reissue of:
(64) Patent No.: 6,674,549
Issued: Jan. 6, 2004
Appl. No.: 09/247,297
Filed: Feb. 10, 1999

(51) Int. Cl.
*H04N 1/00* (2006.01)
*H04N 1/40* (2006.01)

(52) U.S. Cl. ..... 358/425; 358/434; 358/446; 358/447

(58) Field of Classification Search ..... 358/425, 358/434, 446, 447; 370/916
See application file for complete search history.

(56) References Cited

U.S. PATENT DOCUMENTS 4,215,335 A * 7/1980 Doi et al. ..... 714/701
4,385,386 A * 5/1983 Ozeki et al. ..... 372/28
4,393,516 A * 7/1983 Itani ..... 398/154
4,551,764 A * 11/1985 Ogawa ..... 358/228
5,003,398 A * 3/1991 Suzuki ..... 358/209
5,146,353 A * 9/1992 Isoguchi et al. ..... 386/107
5,231,501 A * 7/1993 Sakai ..... 348/231.9
5,295,077 A * 3/1994 Fukuoka ..... 358/479
5,355,132 A * 10/1994 Kani et al. ..... 341/55
5,414,464 A * 5/1995 Sasaki ..... 348/222.1
5,523,861 A * 6/1996 Tanaka et al. ..... 358/475
5,614,946 A * 3/1997 Fukuoka ..... 348/231.4
5,677,733 A * 10/1997 Yoshimura et al. ..... 348/362
5,754,227 A * 5/1998 Fukuoka ..... 348/231.6
5,909,564 A * 6/1999 Alexander et al. ..... 710/316
6,204,889 B1 * 3/2001 Endoh et al. ..... 348/571

* cited by examiner

*Primary Examiner*—Houshang Safaipour
(74) *Attorney, Agent, or Firm*—Perkins Coie LLP

(57) ABSTRACT

Apparatus for acquiring an image utilizing serial transmission between the analog-to-digital converting means and the processing means (ASIC) is disclosed herein. The image acquiring system according to the preferred embodiment of the present invention includes the following devices. The image sensor converts an image to an electrical signal responding to a trigger signal. An amplifier amplifies the power of the electrical signal mentioned above, and the amplified electrical signal is of the analog format. The A/D converting device converts the amplified electrical signal from the analog format to the digital format responding to a reference voltage, wherein the A/D converting device outputs the digitized electrical signal in series. The processing device stores the digitized electrical signal in a memory, wherein the trigger signal is generated by the processing device responding to the digitized electrical signal. The reference voltage mentioned above is generated corresponding to a reference digit, wherein the reference digit is generated responding to the digitized electrical signal, the digitized electrical signal being transmitted to the processing means in series.

23 Claims, 6 Drawing Sheets

AMENDED

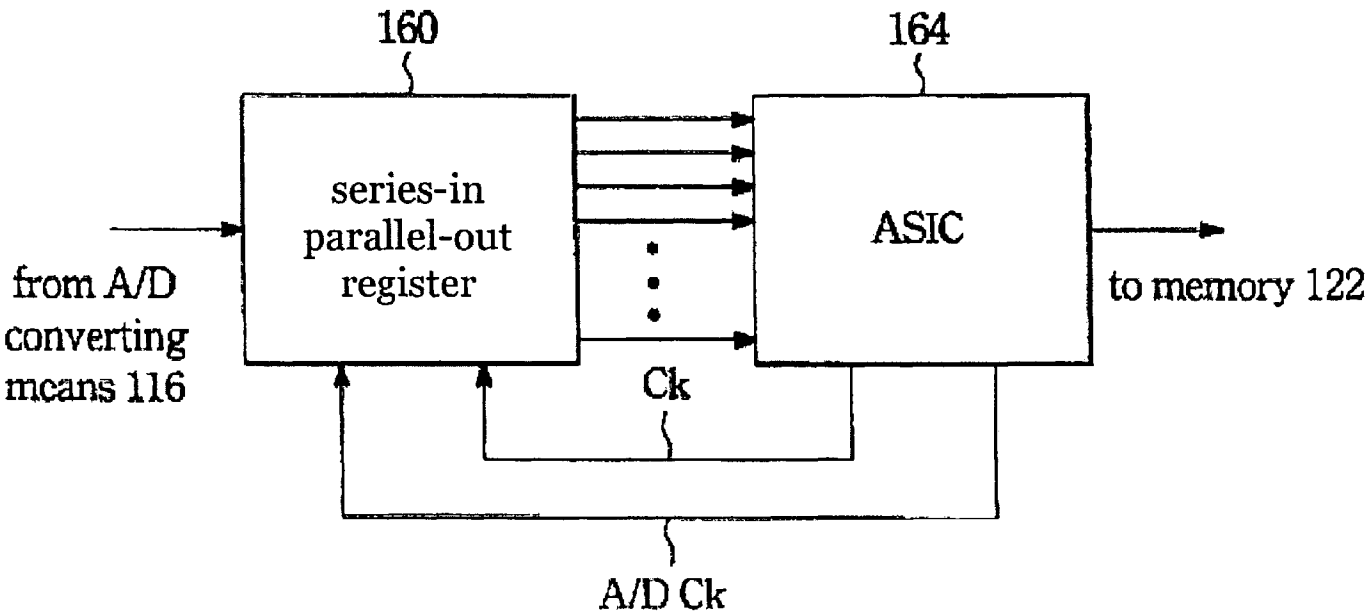
Fig.4
AMENDED

APPARATUS FOR CAPTURING IMAGE

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to an apparatus for capturing an image, and particularly relates to apparatus utilizing serial-output analog-to-digital converter (A/D converter) for capturing image.

2. Description of the Prior Art

The volume of the consuming electronic product has shrunk in the last decade, and the development of electronic technology makes it possible to further reduce the volume of an electronic apparatus. Especially in the recent years, the trend of shrinking the volume of the electronic apparatus has gone on, and many possible methods have been tried to reduce the volume of the electronic apparatus. Because the volume of a computer is continuously reduced with the advent of technology, it also has been a trend for designers of the computer peripheral device to reduce its volume due to the popularity of the portable computer. Thus the reduction of volume has become a trend when designing an electronic apparatus. So it is a goal for the designer of a computer peripheral device to reduce the volume of the periphery device, and many possible methods are tried to reduce the volume of a computer peripheral device.

In fabricating a computer peripheral device, such as an image scanner, a serial-in parallel-out analog-to-digital (A/D) converter is used to convert the electric image signal from analog format to digital format. Referring to FIG. 1, an image sensor 10 is driven by a sensor drive circuit 12 to scan an object, such as a picture, so the image of the object is converted to an electrical signal. The electrical signal acquired by the image sensor 10 is a signal of the analog format. Then an amplifier 14 amplifies the power of the electrical signal, and the amplified electrical signal is fed to the A/D converter 16. The foregoing A/D converter 16 samples the electrical signal of the image of an analog format according to a reference level, thus acquiring a digital format image signal. So the amplified electrical signal of the analog format is converted to the digital format by the A/D converter 16.

In other words, the A/D converter 16 determines the value (in digital format) of every pixel of the image in accordance with the sampling-reference voltage generated by the reference level generator. In a scanner, a D/A (digital-to-analog) converter 18 is used as the reference level generator mentioned above. After the analog format electrical signal is sampled to obtain the digital format electrical signal, the digital format electrical signal is fed to an ASIC (application specific integrated circuit) 20. And then the ASIC 20 sends the acquired digital electrical signal to the memory 22, thus the image of the picture is obtained and stored in the memory 22. In the traditional scanner, the A/D converter 16 a is parallel-output apparatus, so there must be many transmission lines connecting the ASIC 20 to the A/D converter 16.

In a practical integrated circuit of the A/D converter 16, there is a specific number of output-pins that transmit the digital electrical signal, and the ASIC 20 has a number of corresponding input-pins that receive the digital electrical signal from the A/D converter 16. In addition, a corresponding number of transmission lines must be fabricated on a printed circuit board (PCB) to connect the output-pins of the A/D converter 16 and the input-pins of the ASIC 20. The PCB (not shown) is the practical circuit board on which the practical circuit of every functional block shown in FIG. 1 can be fabricated.

In another respect, it is known that while displaying an image in an image system, if more shades can be selected to compose every pixel of the displayed image, the displayed image mentioned above can approach much more alike the original image. In addition, the contrast of the displayed image can be bettered. In other words, the quality of the output image can be improved by increasing the shade of the image acquiring system. To improve the quality of the output image, it is important to increase the density range of the image scanner because it will make possible the situation in which every pixel has more chosen shades.

One of important factor in the quality of the output image of the image acquiring system is the density range of the image acquiring system and image sensor. The other important factor to the quality of the output image of the image acquiring system is the number of bits of the digital electrical signal. Assume that the number of bits of the digital electrical signal is 12 then the signal-to-noise ratio (S/N) is $(2^{12})/1=4096$, so the density range $D=\log 4096=9.6$. So it is clear that the larger the bit number the image signal becomes, the larger the density range becomes. Therefore, if more bits are used to represent a pixel, there are more shades which can be selected in every pixel on the reconstructed output image. Thus the quality of the output image of the image acquiring system is improved thereby.

Though the increase of bit number can improve the image quality of the output image of the image acquiring system, the increased bit number will result in the increase of the pin number of the D/A converter 16 and the ASIC 20. Simultaneously, the increment of the pin number of the D/A converter 16 and the ASIC 20 induces the growth of the number of the transmission lines on the PCB; thus the extension of the area of the PCB is necessary. When more bits are used to represent a pixel of a digital electrical signal, the volume of the image acquiring system is enlarged for the reason mentioned above. So the trade off between the volume of the traditional image acquiring system and the output image quality is unavoidable in the prior art.

SUMMARY OF THE INVENTION

In order to shrink the volume of the image acquiring system, according to the preferred embodiment of the present invention, the apparatus for acquiring an image-utilizing serial transmission between the analog-to-digital converting means and the processing means (ASIC) is disclosed herein. The image acquiring system according to the preferred embodiment of the present invention includes the following devices.

The image sensor converts an image to an electrical signal responding to a trigger signal. An amplifier amplifies the power of the electrical signal mentioned above, and the amplified electrical signal is of the analog format. The A/D converting device converts the amplified electrical signal from the analog format to the digital format responding to a reference voltage, wherein the A/D converting device outputs the digitized electrical signal in series. The processing device stores the digitized electrical signal in a memory, wherein the trigger signal is generated by the processing device responding to the digitized electrical signal. The reference voltage mentioned above is generated corresponding to a reference digit, wherein the reference digit is generated responding to the digitized electrical signal, in addition, the digitized electrical signal being transmitted to the processing means in series.

Furthermore, the image acquiring apparatus according to the preferred embodiment of the present invention further includes a sensor driving device that drives the image sensor responding to the trigger signal. In addition, the image acquiring apparatus includes a digital-to-analog (D/A) converting device that generates the reference voltage according to the reference digit.

The analog-to-digital (A/D) converting device comprises an analog-to-digital converts that converting the amplified electrical from the analog format to the digital format by comparing the amplified electrical signal with the reference voltage, wherein the analog-to-digital converter outputs the signal in parallel. In addition, the A/D converting device includes a parallel-in serial-out register that serially transmitting parallel output of the A/D converter to the processing device responding to a clock pulse. The A/D converting device further includes a controlling device for arranging the digitized electrical signal generated by the analog-to-digital converter in parallel transmission responding to an analog-to-digital clock pulse. The foregoing clock pulse and the analog-to-digital clock pulse are generated by the processing device.

The parallel-in serial-out (PISO) register comprises a shift register and a multiplexer. The shift register controlled by the analog-to-digital clock pulse registers the parallel transmitted digitized electrical signal. The multiplexer arranges the parallel transmitted digitized electrical signal registered in the shift register in serial transmission responding to the output of a serial connected toggle flip flops. The serial connected toggle flip flops are controlled by the analog-to-digital clock pulse and the clock pulse.

The processing device includes a serial-in parallel-out register and a processor (ASIC). The serial-in parallel-out register arranges the digitized electrical signal transmitted by the A/D converting device in parallel transmission responding to the A/D clock pulse and the clock pulse. The processor stores the digitized electrical signal in the memory, wherein the processor generates the analog-to-digital clock pulse and the clock pulse. The processor can be an ASIC. The serial-in parallel-out register includes a set of first serial connected delay flip flops and a set of second serial connected delay flip flops. The first serial connected delay flip flops arrange the digitized electrical signal transmitted by the analog-to-digital converting device in parallel transmission responding to the clock pulse. The second serial connected delay flip flops arrange the output signal from the first serial connected delay flip flops in parallel transmission responding to the A/D clock pulse.

BRIEF DESCRIPTION OF THE DRAWINGS

The above features of the present invention will be more clearly understood from consideration of the following descriptions in connection with accompanying drawings in which:

FIG. 4 illustrates the circuit diagram of the processing means according to one preferred embodiment of the present invention;

DESCRIPTION OF THE PREFERRED EMBODIMENT

Due to the trend of shrinking the volume of consumer electronic products, such as an image scanner, it is important to reduce the area of the PCB. But it is also important to increase the quality of the output image of the image acquiring system, and the increment of the number of bits representing a pixel is a convenient method to improve the quality of the output image. Because the traditional image acquiring system cannot both improve the quality of the output image and shrink the volume, the present invention discloses an apparatus for acquiring image. The apparatus according to the preferred embodiment of the present invention can be an image acquiring system, typically, an image scanner. The apparatus according to the preferred embodiment of the present invention can increase the bit number of a pixel without increasing the volume of the apparatus. So the image acquiring system according to the preferred embodiment of the present invention can improve the quality of the output image without increasing the volume of the image scanner.

Figure 2:
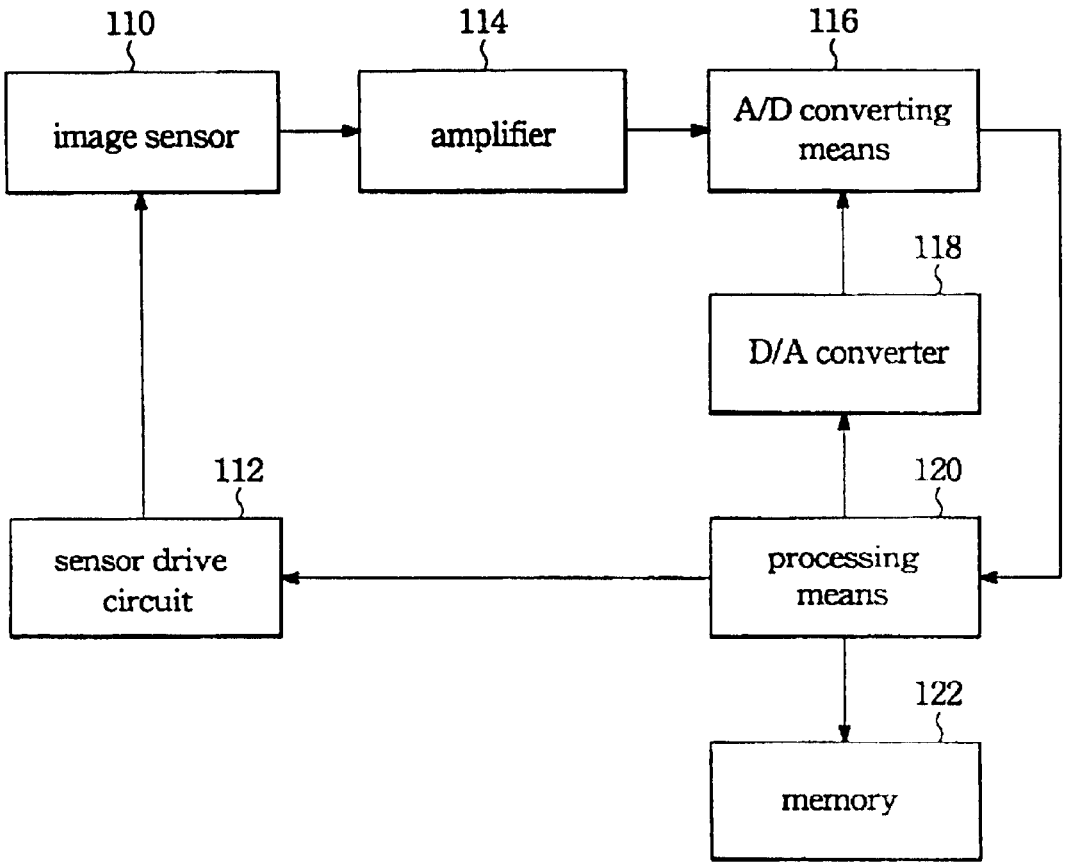
FIG. 2 illustrates the circuit diagram of the image acquiring system according to the preferred embodiment of the present invention.

The functional block diagram of the apparatus according to the preferred embodiment of the present invention is illustrated in FIG. 2. An object, such as a picture, is scanned by an image sensor 110, which is driven by a trigger signal from the sensor drive circuit 122. In the image sensor 110, the image of the object is converted to an electrical signal being a signal of the analog format. Then an amplifier 114 amplifies the power of the electrical signal, and the amplified electrical signal is fed to the A/D converting means 116. The foregoing A/D converting means 116 samples the amplified electrical signal of an analog format to acquire a digital format according to a reference level. The reference level generator mentioned above can be a D/A (digital-to-analog) converter 118 in the image acquiring system according to the preferred embodiment of the present invention. Thus the amplified electrical signal of the analog format is converted to the digital format by the A/D converting means 116.

The A/D converting means 116 determines the value (such as gray level) of every pixel of the image by comparing the voltage level of the amplified electrical signal with the reference level generated by the D/A (digital-to-analog) converter 118. The D/A converter 118 generates the reference level corresponding to the reference digit from the processing means 120. Once the analog format electrical signal is sampled; then the digital format electrical signal is obtained, and the digital format electrical signal is fed to a processing means 120. Then the processing means 120 sends the acquired digital electrical signal to the memory 122, thus the image of the picture is obtained and stored in the memory 122. In the preferred embodiment of the present invention, the A/D converting means 116 is the serial output apparatus, so the output pin of the practical circuit of the A/D converting means 116 is reduced when compared with the prior art A/D converter. Besides, in the image acquiring system according to the preferred embodiment of the present invention, the amount of the transmission line connecting the input pin of the processing means 120 to the output pins of the A/D converting means 116 is also reduced. Furthermore, because the number of the output pins of the A/D converting means is reduced, the number of the input pins of the processing means 120 is reduced to a corresponding number of the output pins of the A/D converter 116.

Due to the largely reduced number of the input pins of the A/D converting means 116, the transmission line, and the output pins of the processing means 120, the area of the PCB (not shown) is decreased. Because the image acquiring system according to the preferred embodiment of the present invention utilizes the parallel-in serial-out A/D converting means 116, even more bits are used to represent a pixel of the output image, the volume of the presented image acquiring system can still be shrunk. So the present invention can improve the image quality without enlarging the volume of the image acquiring system.

Figure 3:
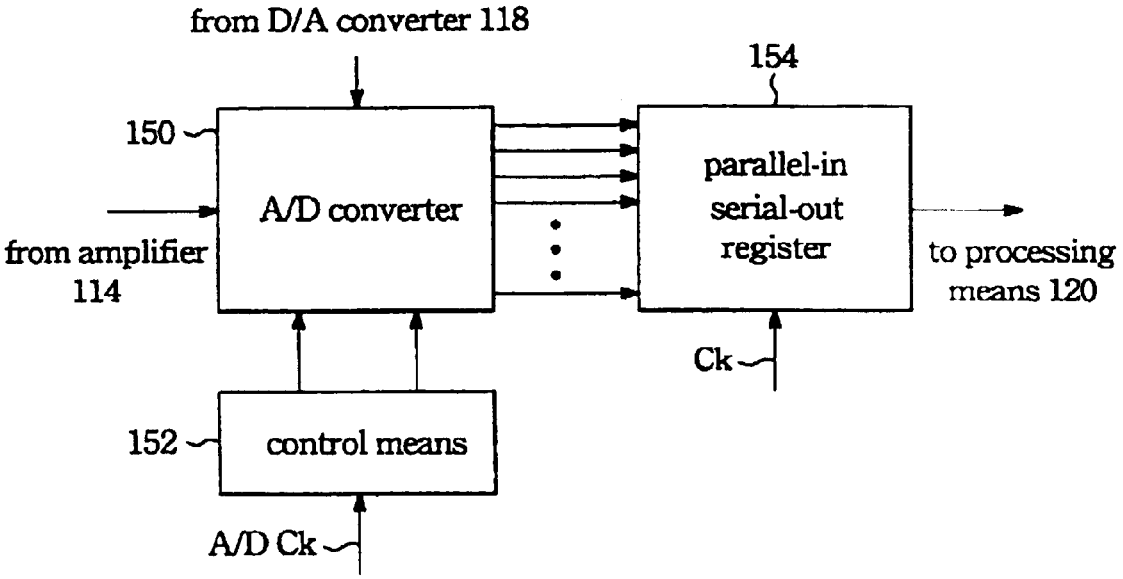
FIG. 3 illustrates the circuit diagram of the A/D converting means according to one preferred embodiment of the present invention.

The functional block of the A/D converting means 116 according to the preferred embodiment of the present invention is illustrated in FIG. 3. The A/D converting means 116 according to the preferred embodiment of the present invention includes an A/D converter 150, a control means 152, and a parallel-in serial-out (PISO) register 154. The amplified electrical signal from the amplifier 114 (in FIG. 2) of the analog format is sampled by being compared with the reference voltage from A/D converter 118 (in FIG. 2) to generate the digital electrical signal. The A/D converter 150 is controlled by the control means 152 when the sampling operation within A/D converter 150 proceeds. In addition, the analog-to-digital clock pulse (pulse A/D Ck) is fed to the control means 152 to trigger the control means 152 to control the sampling operation of the A/D converter 150. Thus the sampled analog electrical signal is fed in parallel to the parallel-in serial-out register 154. The parallel-in serial-out register 154 outputs the digital electrical signal to the processing means in parallel responding to a clock pulse (pulse Ck). According to the description mentioned above, the output of the A/D converting means 116 is in serial.

Figure 1:
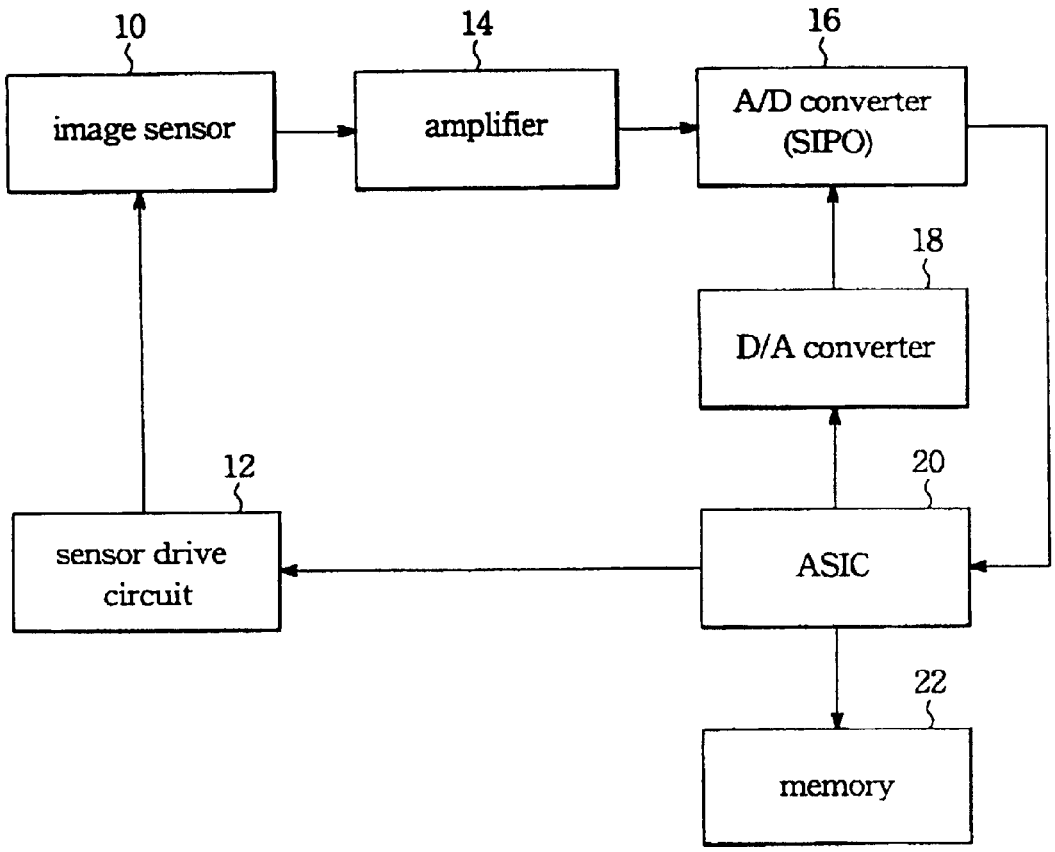
Fig.1 (Prior Art)
FIG. 1 illustrates the circuit diagram of the prior art image acquiring system.

Due to the serial output of the A/D converting means 116, the processing means 122 must be a serial input device. As shown in FIG. 4, in one preferred embodiment of the present invention, the processing means 122 includes a serial-in parallel-out register 160 and an ASIC (applied specification integrated circuit) 164. The digital electrical signal from the A/D converting means 116 is fed to the serial-in parallel-out register 160 in series. The serial-in parallel-out register 160 outputs the digital electrical signal in parallel corresponding to the pulses Ck and A/D Ck. The pulses Ck and A/D Ck come from ASIC 164, and the ASIC 164 feeds the digital electrical signal to the memory 122. Thus the image of the scanned object is stored in the memory. It is noted that the A/D converting means 116 (FIG. 2) and the processing means 120 (FIG. 2) are used to replace the A/D converter 16 (FIG. 1) and the ASIC 20 (FIG. 1). So the number of the transmission lines and the number of the pins of the practical circuit of the A/D converting means 116 and the processing means 120 is greatly reduced.

Figure 5A:
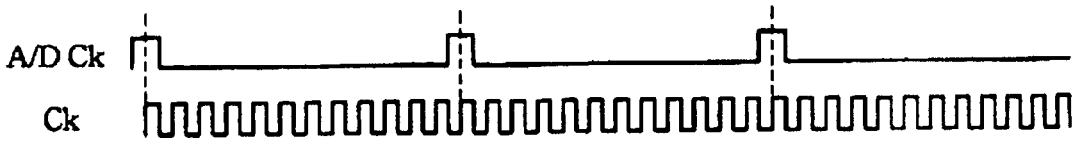
FIG. 5A illustrates the clock pulse and the A/D clock pulse utilized by the disclosed image acquiring system.
Figure 5B:
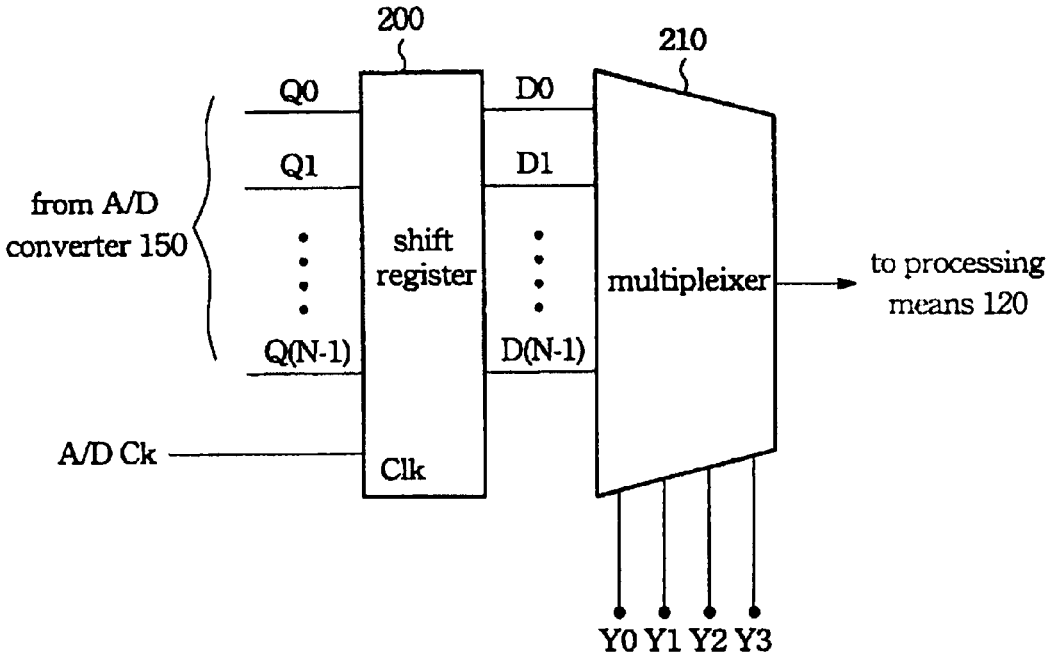
FIG. 5B illustrates the circuit diagram of the first part of the parallel-in serial-out register that arranges the digitized electrical signal according to one preferred embodiment of the present invention.
Figure 5C:
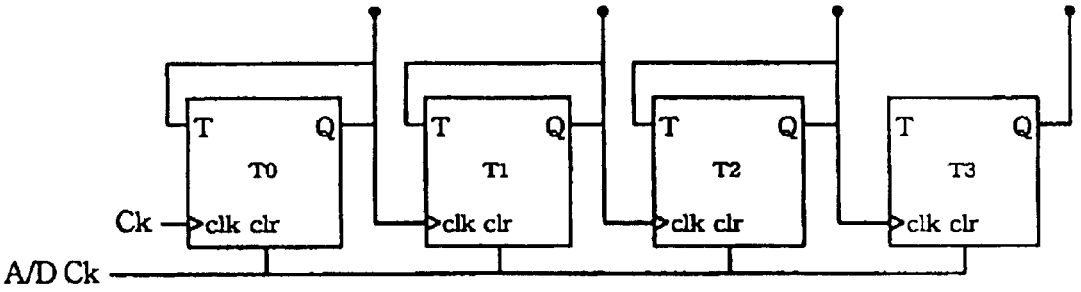
FIG. 5C illustrates the circuit diagram of means that controls the arranging part of the parallel-in serial-out register according to one preferred embodiment of the present invention.
Figure 6:
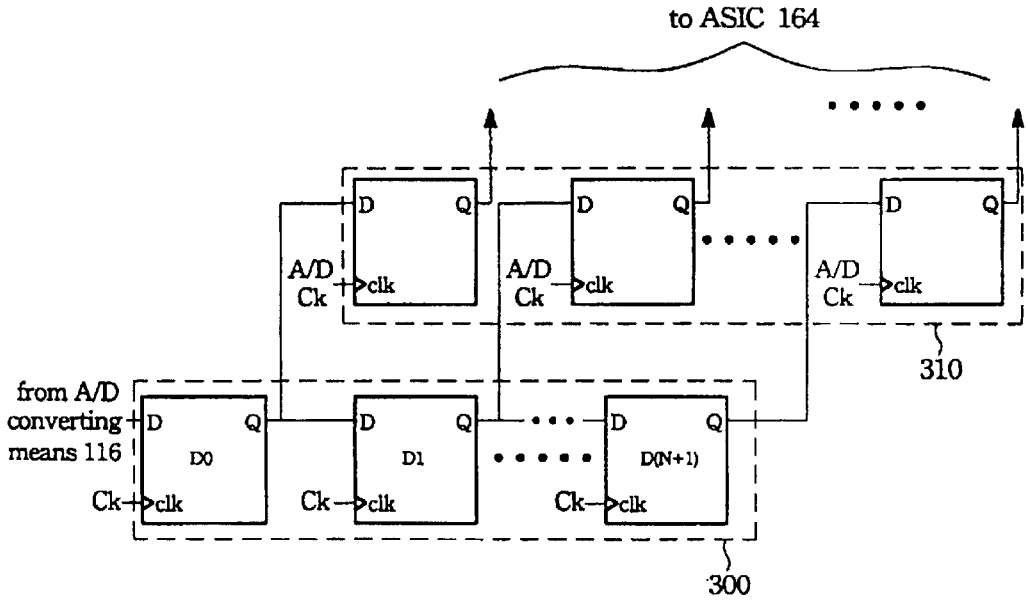
FIG. 6 illustrates the circuit diagram of the serial-in parallel-out register according to one preferred embodiment of the present invention.

To further illustrate the functional diagram of the A/D converting means 116 and the processing means 120, the circuit diagram of the parallel-in serial-out register 154 and the serial-in parallel-out register 160 are shown in FIGS. 5A–5C and FIG. 6 respectively. The pulse A/D Ck shown in FIG. 5A is fed to the shift register 200 (FIG. 5B), and the foregoing trigger signal is generated corresponding to the pulse A/D Ck. The output of the multiplexer 210 (FIG. 5B) is chosen from the voltages at the terminals D0, D1, . . . , D(N−1) corresponding to the output of the serial connected T type flip flops (Toggle FF) shown in FIG. 5C. The serial-in parallel-out register 160 in FIG. 4 can be realized by the apparatus shown in FIG. 6, and the element of the apparatus shown in FIG. 6 are D type flip flops (Delay FF). The serial-in parallel-out register 160 includes a first set of serial connected delay flip flops 300 and a second set of serial connected delay flip flops 310. The first serial connected delay flip flops 300 arranged the digitized electrical signal transmitted by the A/D converting means 116 in parallel transmission responding to the pulse Ck. The second serial connected delay flip flops 310 arrange the output signal from the first serial connected delay flip flops 300 in parallel transmission responding to the pulse A/D Ck. According to the foregoing description, one preferred embodiment of the parallel-in serial-out register 154 and the serial-in parallel-out register 160 of the present invention can be implemented thereby.

As will be understood by persons skilled in the art, the foregoing preferred embodiment of the present invention is illustrative of the present invention rather than limiting the present invention. Having described the invention in connection with a preferred embodiment, for example, if various types of PISO registers and SIPO registers may be used in the preferred embodiment. The modification will now suggest itself to those skilled in the art. While the preferred embodiment of the invention has been illustrated and described, it will be appreciated that various changes can be made therein without departing from the spirit and scope of the invention.

What is claimed is:

1. An [Apparatus] *apparatus* for acquiring an image, said apparatus comprising:

an image sensor for converting the image to an electrical signal responding to a trigger signal;

an amplifier for amplifying power of said electrical signal, said amplified electrical signal being of analog format;

analog-to-digital converting means for converting said amplified electrical signal from said analog format to digital format responding to a reference voltage, wherein said analog-to-digital converting means outputs said digitized electrical signal in series; and processing means for storing said digitized electrical signal in a memory, said trigger signal being generated by said processing means responding to said digitized electrical signal, said reference voltage being generated corresponding to a reference digit, wherein said reference digit is generated responding to said digitized electrical signal, said digitized electrical signal being transmitted to said processing means in series, wherein said processing means comprises:

a serial-in parallel-out register for arranging said digitized electrical signal transmitted by said analog-to-digital converting means in parallel transmission responding to an analog-to-digital clock pulse and a clock pulse, wherein said serial-in parallel-out register comprises:

first serial connected delay flip flops for arranging said digitized electrical signal transmitted by said analog-to-digital converting means in parallel transmission responding to said clock pulse; and second serial connected delay flip flops for arranging an output signal from said first serial connected delay flip flops in parallel transmission responding to said analog-to-digital clock pulse; and a processor for storing said digitized electrical signal in said memory, wherein said processor generates said analog-to-digital clock pulse and said clock pulse.

2. The apparatus [as] *of* claim 1, wherein said image acquiring apparatus further [comprising] *comprises*:

sensor driving means for driving said image sensor responding to said trigger signal; and digital-to-analog converting means for generating said reference voltage according to said reference digit.

3. The apparatus [as] *of* claim 1, wherein said analog-to-digital converting means [comprising] *comprises*:

an analog-to-digital converter for converting said amplified electrical from said analog format to said digital format by comparing said amplified electrical signal with said reference voltage, wherein said analog-to-digital converter outputs signal in parallel;

a parallel-in serial-out register for serially transmitting parallel output of said analog-to-digital converter to said processing means responding to a clock pulse; and controlling means for arranging said digitized electrical signal generated by said analog-to-digital converter in parallel transmission responding to an analog-to-digital clock pulse, said clock pulse and said analog-to-digital clock pulse being generated by said processing means.

4. The apparatus [as] *of* claim 3, wherein said parallel-in serial-out register comprises:

a shift register for registering said parallel transmitted digitized electrical signal, said shift register being controlled by said analog-to-digital clock pulse; and a multiplexer for arranging said parallel transmitted digitized electrical signal registered in said shift register in serial transmission responding to output of [a] serial connected toggle flip flops, said serial connected toggle flip flops being controlled by said analog-to-digital clock pulse and said clock pulse.

5. [Apparatus] *An apparatus* for acquiring *an* image, said apparatus comprising:

an image sensor for converting an image to an electrical signal responding to a trigger signal;

an amplifier for amplifying power of said electrical signal, said amplified electrical signal being of analog format;

analog-to-digital converting means for converting said amplified electrical signal from said analog format to digital format responding to a reference voltage, wherein said analog-to-digital converting means outputs said digitized electrical signal in series, wherein said analog-to-digital converting means [comprising] *comprises*:

an analog-to-digital converter for converting said amplified electrical signal from said analog format to said digital format by comparing said amplified electrical signal with said reference voltage, wherein said analog-to-digital converter outputs the digital [delectgated] electrical signal in parallel;

a parallel-in serial-out register for serially transmitting parallel output of said analog-to-digital converter to said processing means responding to a clock pulse; and controlling means for arranging said digitized electrical signal generated by said analog-to-digital converter in parallel transmission responding to an analog-to-digital clock pulse, said clock pulse and said analog-to-digital clock pulse being generated by said processing means; and processing means for storing said digitized electrical signal in a memory, said trigger signal being generated by said processing means responding to said digitized electrical signal, said reference voltage being generated corresponding to a reference digit, wherein said reference digit is generated responding to said digitized electrical signal, said digitized electrical signal being transmitted to said processing means in series, wherein said processing means [comprising] *comprises*:

a serial-in parallel-out register for arranging said digitized electrical signal transmitted by said analog-to-digital converting means in parallel transmission responding to said analog-to-digital clock pulse and said clock pulse, wherein said serial-in parallel-out register comprises:

first serial connected delay flip flops for arranging said digitized electrical signal transmitted by said analog-to-digital converting means in parallel transmission responding to said clock pulse; and second serial connected delay flip flops for arranging output signal from said first serial connected delay flip flops in parallel transmission responding to said analog-to-digital clock pulse; and a processor for storing said digitized electrical signal in said memory, wherein said processor generates said analog-to-digital clock pulse and said clock pulse.

6. The apparatus [as] *of* claim 5, wherein said image acquiring apparatus further [comprising] *comprises*:

sensor driving means for driving said image sensor responding to said trigger signal; and digital-to-analog converting means for generating said reference voltage according to said reference digit.

7. The apparatus [as] *of* claim 5, wherein said parallel-in serial-out register comprises:

a shift register for registering said parallel transmitted digitized electrical signal, said shift register being controlled by said analog-to-digital clock pulse; and a multiplexer for arranging said parallel transmitted digitized electrical signal registered in said shift register in serial transmission responding to output of [a] serial connected toggle flip flops, said serial connected toggle flip flops being controlled by said analog-to-digital clock pulse and said clock pulse.

8. [Apparatus] *An apparatus* for acquiring image, said apparatus comprising:

an image sensor for converting an image to an electrical signal responding to a trigger signal;

an amplifier for amplifying power of said electrical signal, said amplified electrical signal being of analog format;

analog-to-digital converting means for converting said amplified electrical signal from said analog format to digital format responding to a reference voltage, wherein said analog-to-digital converting means output said digitized electrical signal in series, wherein said analog-to-digital converting means [comprising] *comprises*:

an analog-to-digital converter for converting said amplified electrical from said analog format to said digital format by comparing said amplified electrical signal with said reference voltage, wherein said analog-to-digital converter outputs signal in parallel;

controlling means for arranging said digitized electrical signal generated by said analog-to-digital converter in parallel transmission responding to an analog-to-digital clock pulse; and a parallel-in serial-out register for serially transmitting parallel output of said analog-to-digital converter to said processing means responding to a clock pulse, said clock pulse and said analog-to-digital clock pulse being generated by said processing means, wherein said parallel-in serial-out register comprises:

a shift register for registering said parallel transmitted digitized electrical signal, said shift register being controlled by said analog-to-digital clock pulse; and a multiplexer for arranging said parallel transmitted digitized electrical signal registered in said shift register in serial transmission responding to output of a serial connected toggle flip flops, said serial connected toggle flip flops being controlled by said analog-to-digital clock pulse and said clock pulse; and processing means for storing said digitized electrical signal in a memory, said trigger signal being generated by said processing means responding to said digitized electrical signal, said reference voltage being generated corresponding to a reference digit, wherein said reference digit is generated responding to said digitized electrical signal, said digitized electrical signal being transmitted to said processing means in series, wherein said processing means [comprising] *comprises*:

a processor for storing said digitized electrical signal in said memory, wherein said processor generates said analog-to-digital clock pulse and said clock pulse; and a serial-in parallel-out register for arranging said digitized electrical signal transmitted by said analog-to-digital converting means in parallel transmission responding to said analog-to-digital clock pulse and said clock pulse, wherein said serial-in parallel-out register comprises:

first serial connected delay flip flops for arranging said digitized electrical signal transmitted by said analog-to-digital converting means in parallel transmission responding to said clock pulse; and second serial connected delay flip flops for arranging output signal from said first serial connected delay flip flops in parallel transmission responding to said analog-to-digital clock pulse.

9. The apparatus [as] *of* claim 8, wherein said image acquiring apparatus further [comprising] *comprises*:

sensor driving means for driving said image sensor responding to said trigger signal; and digital-to-analog converting means for generating said reference voltage according to said reference digit.

*10. An apparatus comprising:*

*an image sensor configured to convert an image to an electrical signal;*

*an analog-to-digital converter configured to convert the electrical signal from an analog format to a digital format as a digitized electrical signal;*

*a serial-in parallel-out register configured to receive the digitized electrical signal from said analog-to-digital converter as a series signal, and configured to arrange said digitized electrical signal transmitted by said analog-to-digital converter in parallel transmission responsive to an analog-to-digital clock pulse and a clock pulse, wherein said serial-in parallel-out register comprises:*

*first serial connected delay flip flops configured to arrange said digitized electrical signal transmitted by said analog-to-digital converter in parallel transmission responsive to the clock pulse;*

*second serial connected delay flip flops configured to arrange an output signal from said first serial connected delay flip flops in parallel transmission responsive to the analog-to-digital clock pulse; and*

*a processor configured to store the digitized electrical signal in a memory, said processor configured to generate at least one of the analog-to-digital clock pulse or the clock pulse, or combinations thereof.*

*11. The apparatus of claim 10, further comprising:*

*a digital-to-analog converter coupled to at least one of said analog-to-digital converter, said processor, or combinations thereof.*

*12. The apparatus of claim 10, further comprising:*

*a parallel-in serial-out register configured to serially transmit a parallel output of said analog-to-digital converter to said processor via said serial-in parallel-out register.*

*13. The apparatus of claim 10, further comprising:*

*a parallel-in serial-out register configured to serially transmit a parallel output of said analog-to-digital converter to said processor via said serial-in parallel-out register, said parallel-in serial-out register comprising:*

*a shift register configured to register the parallel output of said analog-to-digital converter; and*

*a multiplexer configured to arrange the parallel output of said analog-to-digital converter registered by said shift register as a serial transmission.*

*14. The apparatus of claim 10, wherein said analog-to-digital converter comprises a parallel output analog-to-digital converter.*

*15. An apparatus comprising:*

*an image sensor configured to convert an image to an electrical signal;*

*analog-to-digital converter configured to convert the electrical signal from an analog format to a digital format as a digitized electrical signal;*

*a parallel-in serial-out register configured to serially transmit a parallel output of said analog-to-digital converter as a serial signal;*

*a serial-in parallel-out register configured to receive the parallel output of said analog-to-digital convert as a series signal from said parallel-in serial-out register, said serial-in parallel-out register comprising:*

*first serial connected delay flip flops configured to arrange the digitized electrical signal transmitted by said analog-to-digital converter as the series signal in parallel transmission responding to a clock pulse; and*

*second serial connected delay flip flops configured to arrange an output signal from said first serial connected delay flip flops in parallel transmission responding to an analog-to-digital clock pulse; and*

*a processor configured to store the digitized electrical signal received from the parallel transmission of said series-in parallel-out register in a memory, said processor configured to convert one or more of the analog-to-digital clock pulse or the clock pulse, or combinations thereof.*

*16. The apparatus of claim 15, further comprising:*

*a digital-to-analog converter coupled between said processor and said analog-to-digital converter.*

*17. The apparatus of claim 15, wherein said parallel-in serial-out register comprises:*

*a shift register configured to register the parallel output of said analog-to-digital converter; and*

*a multiplexer configured to arrange the parallel output of said analog-to-digital converter registered by said shift register as a serial transmission.*

*18. The apparatus of claim 15, wherein said analog-to-digital converter comprises a parallel output analog-to-digital converter.*

*19. The apparatus of claim 10, further comprising a control circuit configured to control said analog-to-digital converter if a sampling operation with said analog-to-digital converter proceeds.*

*20. An image acquiring system comprising:*

*an image sensor configured to convert an image to an electrical signal;*

*an amplifier to amplify the electrical signal;*

*an analog-to-digital converter configured to convert the electrical signal received from said amplifier from an analog format to a digital format as a digitized electrical signal;*

*a parallel-in serial-out register configured to receive the digitized electrical signal from said analog-to-digital converter and arranging the digitized electrical signal in series;*

*a serial-in parallel-out register configured to receive the digitized electrical signal in series from said parallel-in, serial-out register, and configured to arrange said digitized electrical signal transmitted by said analog-to-digital converter in parallel transmission responsive to an analog-to-digital clock pulse and a clock pulse, wherein said serial-in parallel-out register comprises:*

*first serial connected delay flip flops configured to arrange said digitized electrical signal transmitted by said analog-to-digital converter in parallel transmission responsive to the clock pulse; and*

*second serial connected delay flip flops configured to arrange an output signal from said first serial connected delay flip flops in parallel transmission responsive to the analog-to-digital clock pulse;*

*a processor configured to generate at least one of the analog-to-digital clock pulse or the clock pulse, or combinations thereof;*

*a memory configured to store the digitize electrical from said processor;*

*a digital-to-analog converter configured to provide a reference voltage to said analog-to-digital converter in response to a reference digit provided by said processor; and*

*a sensor drive circuit configured to drive said image sensor responsive to a trigger signal.*

*21. The image acquiring system of claim 20, wherein said parallel-in serial-out register comprises:*

*a shift register configured to register the parallel output of said analog-to-digital converter; and*

*a multiplexer configured to arrange the parallel output of said analog-to-digital converter registered by said shift register as a serial transmission.*

*22. The image acquiring system of claim 20, wherein said analog-to-digital converter comprises a parallel output analog-to-digital converter.*

*23. The image acquiring system of claim 20, further comprising a control circuit configured to control said analog-to-digital converter if a sampling operation with said analog-to-digital converter proceeds.*

* * * * *